(12) United States Patent
Hao et al.

(10) Patent No.: US 6,995,064 B2
(45) Date of Patent: Feb. 7, 2006

(54) HALOGEN GETTERING METHOD FOR FORMING FIELD EFFECT TRANSISTOR (FET) DEVICE

(75) Inventors: Ching-Chen Hao, Hsin-Chu (TW); Chao-Chi Chen, Hsin-Chu (TW); Chih-Heng Shen, Hsin-Chu (TW); Chi-Hsun Hsieh, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/813,786

(22) Filed: Mar. 30, 2004

(65) Prior Publication Data

US 2005/0218463 A1 Oct. 6, 2005

(51) Int. Cl.
*H01L 21/00* (2006.01)
*H01L 21/84* (2006.01)
*H01L 21/336* (2006.01)

(52) U.S. Cl. .................................. 438/301; 438/153
(58) Field of Classification Search ........ 438/300–307, 438/770–775, 153–154; 257/382–412
See application file for complete search history.

(56) References Cited

U.S. PATENT DOCUMENTS

| 5,506,178 A | * | 4/1996 | Suzuki et al. ................ 438/773 |
| 6,586,289 B1 | * | 7/2003 | Dokumaci et al. .......... 438/303 |
| 6,713,824 B1 | * | 3/2004 | Mikata et al. ............... 257/412 |

* cited by examiner

*Primary Examiner*—Cuong Nguyen
(74) *Attorney, Agent, or Firm*—Tung & Assoc

(57) ABSTRACT

A thermal oxidation method for forming a gate dielectric layer for use within a field effect transistor device employs a thermal oxidizing atmosphere comprising a halogen getter material. By employing the halogen getter material, the field effect transistor device is formed with enhanced performance, in particular with respect to negative bias temperature instability lifetime.

20 Claims, 2 Drawing Sheets

HALOGEN GETTERING METHOD FOR FORMING FIELD EFFECT TRANSISTOR (FET) DEVICE

BACKGROUND OF THE INVENTION

1. Field of the Invention

The present invention relates generally to methods for forming field effect transistor (FET) devices. More particularly, the present invention relates to methods for forming field effect transistor (FET) devices with enhanced performance.

2. Description of the Related Art

Common in the semiconductor product fabrication art is the fabrication and use of field effect transistor devices as switching devices within logic semiconductor products, memory semiconductor products and embedded logic and memory semiconductor products.

While field effect transistor devices are thus common in the semiconductor product fabrication art and often essential for fabricating semiconductor products, field effect transistor devices are nonetheless not entirely without problems.

In that regard, as semiconductor product integration levels have increased and semiconductor device dimensions have decreased, it has become increasingly difficult to form within semiconductor products field effect transistor devices with enhanced performance.

It is thus desirable in the semiconductor product fabrication art to fabricate field effect transistor devices with enhanced performance.

It is towards the foregoing object that the present invention is directed.

Various methods have been disclosed within the semiconductor product fabrication art for forming field effect transistor devices with desirable properties.

Included but not limiting among the methods are those disclosed within: (1) Yeh et al., in U.S. Pat. No. 5,393,686 (a halogen gettering method for forming within a field effect transistor device a gate dielectric layer such as to form the field effect transistor device with enhanced performance); and (2) Grider et al., in U.S. Pat. No. 6,093,659 (a halogen doping method for forming within a semiconductor substrate a pair of gate dielectric layers with differing thicknesses such as to provide a pair of field effect transistor devices with differing performance properties).

Desirable in the semiconductor product fabrication art are additional methods for forming field effect transistor devices with enhanced performance.

It is towards the foregoing object that the present invention is directed.

SUMMARY OF THE INVENTION

A first object of the invention is to provide a method for forming a field effect transistor device.

A second object of the invention is to provide a method in accord with the first object of the invention, wherein the field effect transistor device is formed with enhanced performance.

In accord with the objects of the invention, the invention provides a method for forming a gate dielectric layer for use within a field effect transistor device.

To practice the method of the invention, there is first provided a semiconductor substrate. The semiconductor substrate is then thermally oxidized within a thermal oxidizing atmosphere comprising a halogen getter material to form a gate dielectric layer upon a thermally oxidized semiconductor substrate.

The invention provides a method for forming a field effect transistor device, where the field effect transistor device is formed with enhanced performance.

The invention realizes the foregoing object by employing a thermal oxidizing atmosphere comprising a halogen getter material when thermally oxidizing a semiconductor substrate such as to form a gate dielectric layer upon a thermally oxidized semiconductor substrate.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides a method for forming a field effect transistor device, where the field effect transistor device is formed with enhanced performance.

The invention realizes the foregoing object by employing a thermal oxidizing atmosphere comprising a halogen getter material when thermally oxidizing a semiconductor substrate such as to form a gate dielectric layer upon a thermally oxidized semiconductor substrate.

FIG. 1 to FIG. 5 show a series of schematic cross-sectional diagrams illustrating the results of progressive stages of fabricating a pair of field effect transistor devices in accord with a preferred embodiment of the invention.

Figure 1:
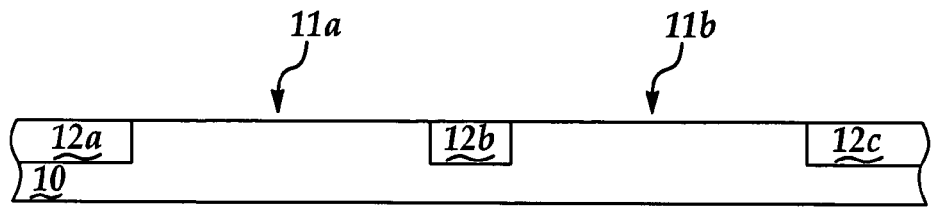
FIG. 1, FIG. 2, FIG. 3, FIG. 4 and FIG. 5 show a series of schematic cross-sectional diagrams illustrating the results of progressive stages of forming a pair of field effect transistor devices within a semiconductor product in accord with a preferred embodiment of the invention.

FIG. 1 shows a schematic cross-sectional diagram of the semiconductor product at an early stage in its fabrication in accord with the preferred embodiment of the invention.

FIG. 1 shows a semiconductor substrate 10 having formed therein a series of isolation regions 12a, 12b and 12c which define a pair of active regions 11a and 11b of the semiconductor substrate 10.

Within the invention, the semiconductor substrate 10 is formed of a thermally oxidizable semiconductor material, such as but not limited to a thermally oxidizable silicon semiconductor material or a thermally oxidizable silicon-germanium alloy semiconductor material. More typically, the semiconductor substrate 10 is formed of a thermally oxidizable silicon semiconductor material which may have formed therein doped regions as are appropriate for forming the pair of field effect transistor devices within the semiconductor product whose schematic cross-sectional diagram is illustrated in FIG. 1.

Within the invention, the series of isolating regions 12a, 12b and 12c may be formed employing methods and materials as are otherwise generally conventional in the semiconductor product fabrication art, to provide isolation regions such as but not limited to local oxidation of silicon oxidation regions and shallow trench isolation regions.

Within the invention, the semiconductor product as illustrated in FIG. 1 will typically and preferably be cleaned within an aqueous cleaning solution such as an ammonia and hydrogen peroxide aqueous cleaning solution.

Figure 2:
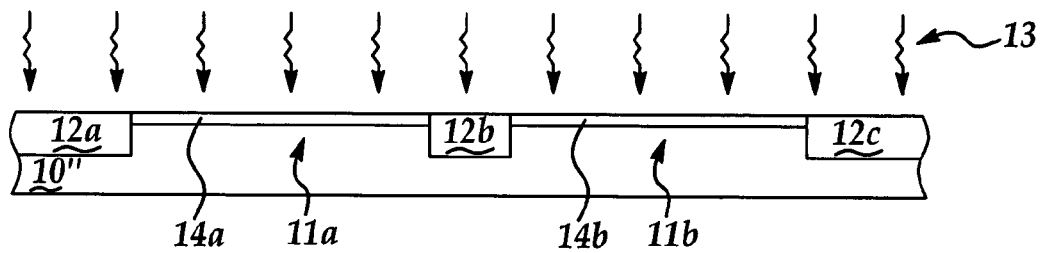

FIG. 2 shows a schematic cross-sectional diagram illustrating the results of further processing of the semiconductor product of FIG. 1.

FIG. 2 shows the results of thermally oxidizing the semiconductor substrate 10 as illustrated in FIG. 1 within the first thermal oxidizing atmosphere 13 to form a pair of first gate dielectric layers 14a and 14b upon the pair of active regions 11a and 11b of a once thermally oxidized semiconductor substrate 10'.

Within the invention, the first thermal oxidizing atmosphere 13 comprises a halogen getter material when forming the pair of first gate dielectric layers 14a and 14b upon the pair of active regions 11a and 11b of the once thermally oxidized semiconductor substrate 10'. The halogen getter material may comprise a fluorine, chlorine, iodine or bromine halogen getter material, but preferably a chlorine halogen getter material. Preferable chlorine halogen getter materials include, but are not limited to, molecular chlorine (i.e., $Cl_2$), hydrogen chloride (i.e., HCl) and one to three carbon atoms perchlorocarbons and hydrochlorocarbons. Within the invention, 1,2-trans-dichloroethylene ($C_2H_2Cl_2$) is a particularly preferred chlorine halogen getter material.

The first thermal oxidizing atmosphere 13 may be a dry thermal oxidizing atmosphere (i.e., absent moisture) or a wet thermal oxidizing atmosphere (i.e., containing moisture). The first thermal oxidizing atmosphere 13 may be a purely oxidizing atmosphere (i.e., typically consisting of oxygen) or a nitriding and oxidizing atmosphere (i.e., typically consisting of a nitrogen containing nitridant and an oxygen containing oxidant, such as nitrous oxide or nitric oxide).

Typically, the first thermal oxidizing atmosphere 13 also employs: (1) a reactor chamber pressure of from about 700 to about 800 torr; (2) a temperature of from about 750 to about 850 degrees centigrade; (3) an oxidant material (typically oxygen) flow rate of from about 3000 to about 5000 standard cubic centimeters per minute (sccm); (4) a halogen getter material flow rate of from about 200 to about 300 standard cubic centimeters per minute (sccm); and (5) a thermal oxidation process time of from about 15 to about 35 minutes. Typically each of the pair of first gate dielectric layers 14a and 14b is formed to a thickness of from about 50 to about 60 angstroms.

Figure 3:
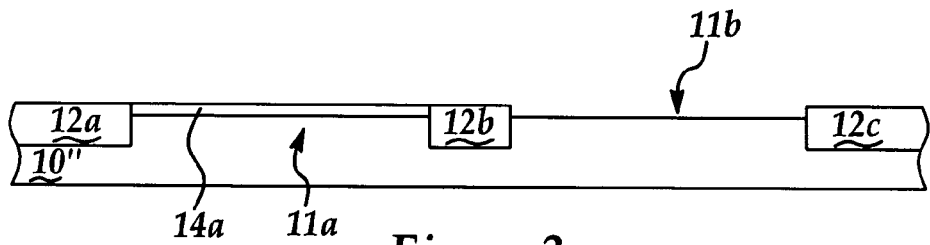

FIG. 3 shows a schematic cross-sectional diagram illustrating the results of further processing of the semiconductor product of FIG. 2.

FIG. 3 shows the results of stripping the first gate dielectric layer 14b from the active region 11b of the once thermally oxidized semiconductor substrate 10' as illustrated within the schematic cross-sectional diagram of FIG. 2.

Within the invention, the first gate dielectric layer 14b may be striped from the semiconductor product as illustrated in FIG. 2 to provide the semiconductor product as illustrated in FIG. 3 while employing masked stripping methods as are conventional in the semiconductor product fabrication art. Such masked stripping methods will typically employ a masking of the first gate dielectric layer 14a with a mask layer, such as a photoresist mask layer, and a stripping of the first gate dielectric layer 14b with a hydrofluoric acid containing etchant under circumstances where the first gate dielectric layer 14b is formed of a non-nitrided silicon oxide material.

Figure 4:
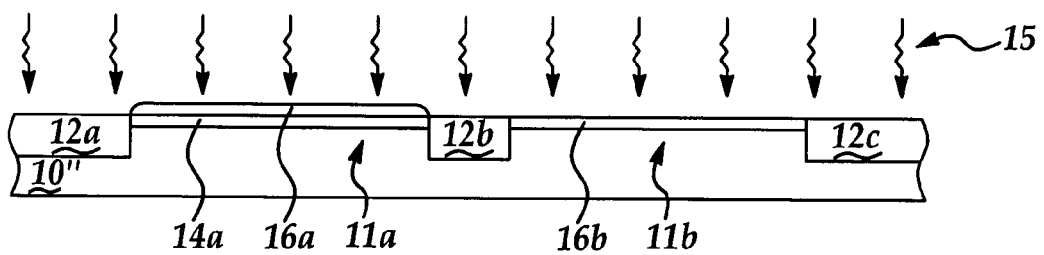

FIG. 4 shows a schematic cross-sectional diagram illustrating the results of further processing of the semiconductor product of FIG. 3.

FIG. 4 shows the results of forming: (1) a second gate dielectric layer 16a upon the first gate dielectric layer 14a; and (2) forming a second gate dielectric layer 16b upon the active region 11b of a twice thermally oxidized semiconductor substrate 10" incident to thermal oxidation within a second thermal oxidizing atmosphere 15.

Within the invention, the second thermal oxidizing atmosphere 15 is otherwise generally analogous to the first thermal oxidizing atmosphere 13, but the second thermal oxidizing atmosphere 15 is preferably a nitriding thermal oxidizing atmosphere which employs a nitriding oxidant such as nitrous oxide or nitric oxide and the second thermal oxidizing atmosphere 15 does not necessarily (and generally does not) comprise a halogen getter material. Thus, each of the pair of second gate dielectric layers 16a and 16b is preferably formed of a nitrided silicon oxide material, rather than a non-nitrided silicon oxide material from which is preferably formed each of the pair of first gate dielectric layers 14a and 14b. Typically, each of the second gate dielectric layers 16a and 16b is formed to a thickness of from about 10 to about 25 angstroms.

Figure 5:
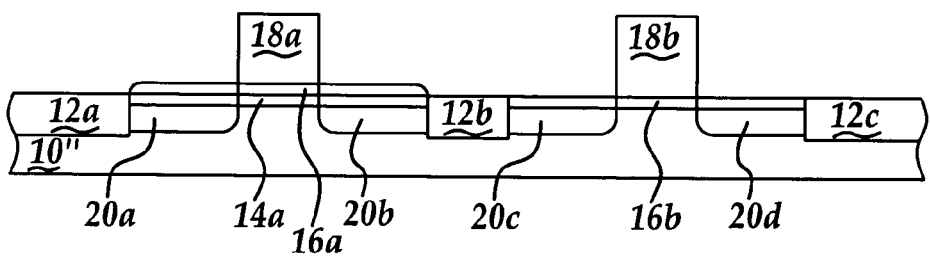

FIG. 5 shows a schematic cross-sectional diagram illustrating the results of further processing of the semiconductor product of FIG. 4.

FIG. 4 shows the results of: (1) forming upon the second gate dielectric layer 16a a gate electrode 18a and forming into the active region 11a of the twice thermally oxidized semiconductor substrate 10" a pair of source/drain regions 20a and 20b to form a first field effect transistor device within and upon the active region 11a of the twice thermally oxidized semiconductor substrate 10"; and (2) forming upon the second gate dielectric layer 16b a gate electrode 18b and forming into the active region 11b of the twice thermally oxidized semiconductor substrate 10" a pair of source/drain regions 20c and 20d to form a second field effect transistor device within and upon the active region 11b of the twice thermally oxidized semiconductor substrate 10".

Within the invention, the pair of gate electrodes 18a and 18b may be formed employing methods and materials as are generally conventional in the semiconductor product fabrication art. Typically, the pair of gate electrodes 18a and 18b is formed of a doped polysilicon (having a dopant concentration of from about 1E20 to about 1E22 dopant per cubic centimeter) or polycide (doped polysilicon/metal silicide stack) material, formed to a thickness of from about 1500 to about 3500 angstroms. In addition, the series of source/drain regions 20a, 20b, 20c and 20d may also be formed employing methods as are generally conventional in the semiconductor product fabrication art, to form the series of source/drain regions 20a, 20b, 20c and 2d of a dopant concentration from about 1E18 to about 1E20 dopant atoms per cubic centimeter, and of an appropriate dopant polarity.

The semiconductor product as illustrated in FIG. 5 provides a semiconductor product fabricated in accord with the preferred embodiment of the invention. The semiconductor product has formed therein a pair of field effect transistor devices, one having a laminated bilayer nitrided silicon oxide/non-nitrided silicon oxide gate dielectric layer, the other having a single layer nitrided silicon oxide gate dielectric layer. Within the invention, the first field effect transistor device having the bilayer laminated gate dielectric layer is generally employed for semiconductor product power or input/output functions, where protection from transient voltages swings may be of concern. The second field effect transistor device having the thinner single layer gate dielectric layer is typically employed within logic applications where transistor speed is an important consideration.

Within each of the first field effect transistor device and the second field effect transistor device, a gate dielectric layer is formed with enhanced performance insofar as the gate dielectric layer is formed employing a thermal oxidation method that employs a thermal oxidizing atmosphere comprising a halogen getter material when forming the gate dielectric layer. The invention thus differs from related methods that may either: (1) a halogen dopant treatment of a semiconductor substrate prior to forming a gate dielectric layer thereupon; or (2) a halogen gettering treatment of a gate dielectric layer after it is formed. Alternatively stated, the invention employs a halogen getter treatment in-situ when forming a gate dielectric layer upon a semiconductor substrate.

EXAMPLE

To illustrate the value of the invention, a semiconductor product having formed therein two field effect transistor devices was fabricated in accord with the preferred embodiment of the invention.

The semiconductor product comprised a semiconductor substrate having formed thereupon a pair of non-nitrided silicon oxide gate dielectric layers formed employing a first thermal oxidation of a semiconductor substrate within a first thermal oxidizing atmosphere comprising a transdichloroethylene chlorine getter material when thermally oxidizing the semiconductor getter material when thermally oxidizing the semiconductor substrate. The first thermal oxidation method also employed: (1) a reactor chamber pressure of about 760 torr; (2) a thermal oxidation temperature of about 800 degrees centigrade; (3) a dry oxygen oxidant at a flow rate of about 4000 standard cubic centimeters per minute; and (4) a transdichloroethylene flow rate of about 250 standard cubic centimeters per minute. The first thermal oxidation method provided a pair of first gate dielectric layers upon a pair of active regions of the semiconductor substrate, each gate dielectric layer having a thickness of about 50 angstroms.

One of the silicon oxide gate dielectric layers were then stripped from one of the active regions of the semiconductor substrate, while employing an aqueous hydrofluoric acid etchant at elevated temperature.

A pair of second gate dielectric layers was then formed, one each upon: (1) the remaining non-nitrided silicon oxide gate dielectric layer; and (2) the remaining uncovered active region of the semiconductor substrate. This second pair of gate dielectric layers was formed of a nitrided silicon oxide material formed employing a thermal oxidation method which employed a dry nitrous oxide oxidant, rather than a dry oxygen oxidant, and with no transdichloroethylene chlorine getter material or any other getter material.

A pair of field effect transistor devices was then fabricated within the pair of active regions of the semiconductor substrate while employing gate patterning and source/drain region ion implantation as is otherwise generally conventional in the semiconductor product fabrication art. For comparison purposes, an additional pair of field effect transistor devices was fabricated in accord with the foregoing process description, but without a halogen or chlorine getter material within either the first thermal oxidizing method or the second thermal oxidizing method.

Figure 6:
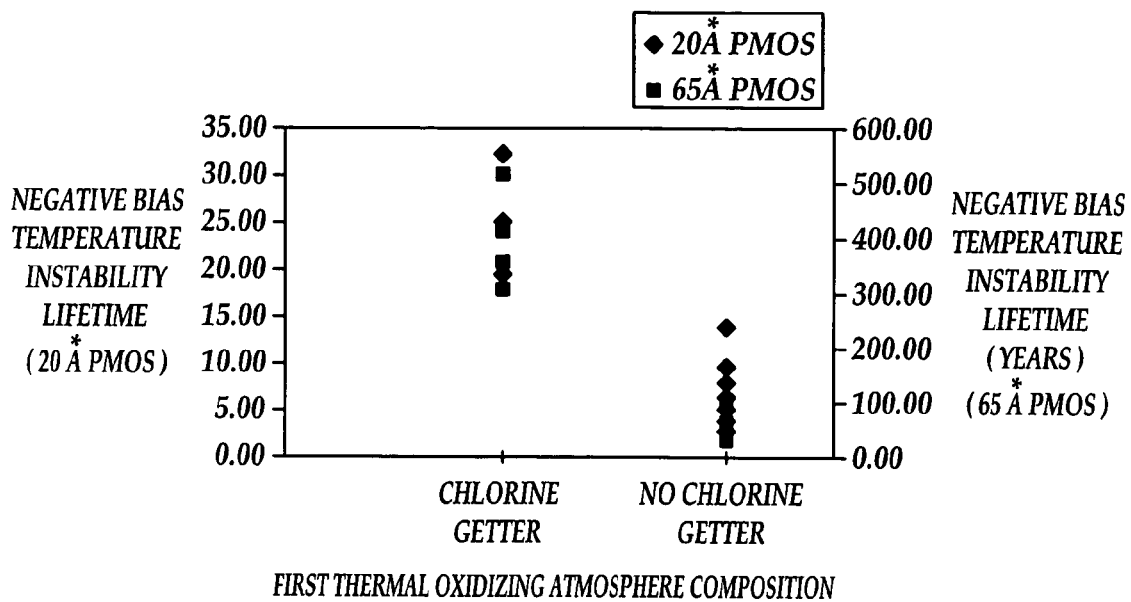
FIG. 6 shows a graph of Negative Bias Temperature Instability (NBTI) Lifetime versus Thermal Oxidizing Atmosphere Composition (with and without presence of chlorine getter material) for forming a pair of field effect transistor devices in accord with the invention and not in accord with the invention.

Negative bias temperature instability lifetime measurements were than obtained for each of the two series of field effect transistor devices. Results of the measurements are shown within the graph of FIG. 6, which illustrates negative bias temperature instability lifetimes as a function of silicon oxide gate oxidation process (either with transdichloroethylene chlorine getter material or without transdichloroethylene chlorine getter material within the first thermal oxidizing atmosphere). Within FIG. 6, square data points correspond with the bilayer (non-nitrided silicon oxide/nitrided silicon oxide) gate dielectric layers of aggregate thickness about 65 angstroms while diamond shaped data points correspond with the single layer (non-nitrided silicon oxide) gate a dielectric layers of thickness about 20 angstroms. As is illustrated within FIG. 6, for field effect transistor devices having formed therein either the single layer gate dielectric layers or the bilayer gate dielectric layers, significant increases in negative bias temperature instability lifetimes are observed when employing a thermal oxidation method employing a halogen gettering material for forming a first gate dielectric layer formed of a non-nitrided silicon oxide material, whether or not the first gate dielectric layer is stripped prior to forming a nitrided silicon oxide gate dielectric layer.

As is understood by a person skilled in the art, the preferred embodiment and example of the invention are illustrative of the invention rather than limiting of the invention. Revisions and modifications may be made to methods, materials, structures and dimensions in accord with the preferred embodiment and example of the invention, while still providing a semiconductor product in accord with the invention, further in accord with the accompanying claims.

What is claimed is:

1. A method for forming a gate dielectric layer comprising:
   providing a semiconductor substrate;
   thermally oxidizing the semiconductor substrate within a first thermal oxidizing atmosphere comprising a halogen getter material to form a first gate dielectric layer comprising a once thermally oxidized semiconductor substrate; and,
   thermally oxidizing the once thermally oxidized semiconductor substrate within a second thermal oxidizing atmosphere not comprising a halogen getter material to form a second gate dielectric layer on the first dielectric layer.

2. The method of claim 1 wherein the semiconductor substrate is a silicon semiconductor substrate.

3. The method of claim 1 wherein the semiconductor substrate is a silicon-germanium alloy semiconductor substrate.

4. The method of claim 1 wherein the first gate dielectric layer is formed from a non-nitrided silicon oxide material.

5. The method of claim 1 wherein the halogen getter material comprises chlorine.

6. The method of claim 5 wherein the halogen getter material is selected from the group consisting of chlorine, hydrogen chloride, and one to three carbon atom chlorocarbons and hydrochlorocarbons.

7. The method of claim 1 wherein the thermal oxidizing atmosphere is selected from the group consisting of wet thermal oxidizing atmosphere and dry thermal oxidizing atmospheres.

8. The method of claim 1 wherein the first gate dielectric layer is stripped over a portion of the semiconductor substrate comprising a second active region prior to forming the second gate dielectric layer, said second gate dielectric layer formed to comprise a bilayer gate dielectric on a first active region and formed to comprise a single layer gate dielectric on the second active region.

9. The method of claim 1 wherein the second gate dielectric layer comprises a nitrided silicon oxide material.

10. The method of claim 1 wherein the first gate dielectric layer is stripped over a portion of the semiconductor substrate comprising a second active region prior to forming the second gate dielectric layer, said second gate dielectric layer formed to comprise a bilayer gate dielectric on a first active region and formed to comprise a single layer gate dielectric on the second active region.

11. A method for forming a gate dielectric layer comprising:
   providing a semiconductor substrate;
   thermally oxidizing the semiconductor substrate within a first thermal oxidizing atmosphere comprising a halogen getter material to form a first gate dielectric layer upon a once thermally oxidized semiconductor substrate; and
   thermally oxidizing the once thermally oxidized semiconductor substrate within a second thermal oxidizing atmosphere not comprising a halogen getter material to form a second gate dielectric layer over a twice thermally oxidized semiconductor substrate.

12. The method of claim 11 wherein the semiconductor substrate is a silicon semiconductor substrate.

13. The method of claim 11 wherein the semiconductor substrate is a silicon-germanium alloy semiconductor substrate.

14. The method of claim 11 wherein the first gate dielectric layer comprises a non-nitrided silicon oxide material.

15. The method of claim 11 wherein the second gate dielectric layer comprises a nitrided silicon oxide material.

16. The method of claim 11 wherein the halogen getter material comprises chlorine.

17. The method of claim 16 wherein the halogen getter material is selected from the group consisting of chlorine, hydrogen chloride, and one to three carbon atom chlorocarbons and hydrochlorocarbons.

18. The method of claim 11 wherein the first and second thermal oxidizing atmospheres are selected from the group consisting of wet thermal oxidizing atmospheres and dry thermal oxidizing atmospheres.

19. The method of claim 11 wherein the first gate dielectric layer is stripped over a portion of the once thermally oxidized semiconductor substrate prior to forming the second gate dielectric layer.

20. The method of claim 11 wherein the second gate dielectric layer is formed upon the first gate dielectric layer.

* * * * *